United States Patent
Berry, II

(10) Patent No.: US 7,292,062 B2
(45) Date of Patent: Nov. 6, 2007

(54) DISTRIBUTION OF SIGNALS THROUGHOUT A SPINE OF AN INTEGRATED CIRCUIT

(75) Inventor: Jon Stanley Berry, II, Raleigh, NC (US)

(73) Assignee: Infineon Technologies, AG, Neubiberg (DE)

( * ) Notice: Subject to any disclaimer, the term of this patent is extended or adjusted under 35 U.S.C. 154(b) by 169 days.

(21) Appl. No.: 11/118,374

(22) Filed: May 2, 2005

(65) Prior Publication Data

US 2006/0244483 A1    Nov. 2, 2006

(51) Int. Cl.
G06F 7/38 (2006.01)
H03K 19/173 (2006.01)
H01L 25/00 (2006.01)
(52) U.S. Cl. .................. 326/38; 326/37; 326/39; 326/40; 326/41; 326/47; 326/101
(58) Field of Classification Search .................. 326/38, 326/37, 39, 40, 41, 46, 93, 47, 101
See application file for complete search history.

(56) References Cited

U.S. PATENT DOCUMENTS

| | | | | | |
|---|---|---|---|---|---|
| 5,557,417 | A | * | 9/1996 | Ishii | 386/93 |
| 6,064,225 | A | * | 5/2000 | Andrews et al. | 326/41 |
| 6,310,511 | B1 | | 10/2001 | Weinfurtner | |
| 6,829,756 | B1 | * | 12/2004 | Trimberger | 716/6 |
| 7,093,204 | B2 | * | 8/2006 | Oktem et al. | 716/1 |
| 7,138,827 | B1 | * | 11/2006 | Trimberger | 326/41 |

OTHER PUBLICATIONS

Author: Sajjan G. Shiva, Title: Introduction to Logic Design,2nd Ed., Publisher: Marcel Dekker, Inc. □□Pertinent pp. 230-232, 468.*
Author: Sajjan G. Shiva, Title: Introduction to Logic Design,2nd Ed., Publisher: Marcel Dekker, Inc. Pertinent pp. 230-232,468.*
Gillingham, P.; "Unleashing the Power of Embedded DRAM"; retrieved from the Internet Mar. 29, 2005; www.design-reuse.com; 8 pages.
Weinfurtner, O., et al.; "Advanced Controlling Scheme for a DRAM Voltage Generator System" IEEE Journal of Solid-State Circuits, vol. 35, No. 4, Apr. 2000; pp. 552-563.

* cited by examiner

Primary Examiner—Rexford Barnie
Assistant Examiner—Thienvu Tran
(74) Attorney, Agent, or Firm—Edell, Shapiro & Finnan, LLC

(57) ABSTRACT

A system and method for distributing signals throughout an integrated circuit (IC). The system comprises a transmitter unit and a plurality of receiver units. The transmitter unit combines a plurality of signals into a serial signal stream and couples the serial signal stream to a conductor for distribution to a plurality of destinations in the IC. There is a receiver unit at each of the plurality of destinations and connected to the conductor. Each receiver unit extracts one of the plurality of signals from the serial signal stream received on the conductor. The transmitter unit comprises a multiplexer circuit and a counter circuit and time multiplexes the plurality of signals to form a serial signal stream, wherein a signal is selected for a time slot based on a count value of the counter circuit. The counter signal is also supplied to each receiver unit, which uses the counter signal to determine when to latch a signal from the serial signal stream.

13 Claims, 6 Drawing Sheets

DISTRIBUTION OF SIGNALS THROUGHOUT A SPINE OF AN INTEGRATED CIRCUIT

FIELD OF THE INVENTION

This invention relates to integrated circuit (IC) devices, and more particularly to techniques to reduce distribution wire congestion in an IC.

BACKGROUND OF THE INVENTION

In IC devices, it is necessary to distribute signals from one area of the IC to another area. For example, in dynamic random access memory (DRAM) ICs, many fuse-triggered signals, and other direct current (DC) or near DC signals are distributed in the IC through a region of the IC called the "spine". IC design improvements that increase the performance or testability of an IC often increase rather than decrease the number of DC or test mode signals that must be routed through the spine. With increased IC complexity, more signals must be distributed and consequently spine layouts are becoming wire-constrained. However, if the spine height can be reduced, more ICs or chips can be formed on a wafer.

Many of the signals that are distributed in an IC do not change. For example, test mode signals change very infrequently. As a result, it is not necessary to have dedicated conductor wire traces for these signals that occupy critical space in the spine of the IC.

Techniques are needed to reduce the number of conductive traces required for distributing signals in an IC, thereby reducing wire congestion in the spine or other distribution region of an IC.

SUMMARY OF THE INVENTION

Briefly, a system and method are provided for distributing signals throughout an integrated circuit (IC). The system comprises a transmitter unit and a plurality of receiver units. The transmitter unit combines a plurality of signals into a serial signal stream and couples the serial signal stream to a conductor for distribution to a plurality of destinations in the IC. There is a receiver unit at each of the plurality of destinations and connected to the conductor. Each receiver unit extracts one of the plurality of signals from the serial signal stream received on the conductor. The transmitter unit comprises a multiplexer circuit and a counter circuit and time multiplexes the plurality of signals to form a serial signal stream, wherein a signal is selected for a time slot based on a count value of the counter circuit. The counter signal is also supplied to each receiver unit, which uses the counter signal to determine when to latch a signal from the serial signal stream.

Similarly, a method is provided for distributing signals throughout an IC. The method comprises combining or multiplexing a plurality of signals into a serial signal stream; coupling the serial signal stream over a conductor to each of a plurality of destinations in the IC; and at a destination, extracting one of the plurality of signals from the serial signal stream.

The system and method described herein reduces the number of wires or conductors needed to distribute signals throughout an IC. Only a single conductor or wire is needed to distribute the serial signal stream and an appropriate number conductors to carry individual bits of the counter signal.

The objects and advantages of the invention will become more readily apparent when reference is made to the following description taken in conjunction with the accompanying drawings, wherein like reference numerals in the various figures are utilized to designate like components.

DETAILED DESCRIPTION

Figure 1:
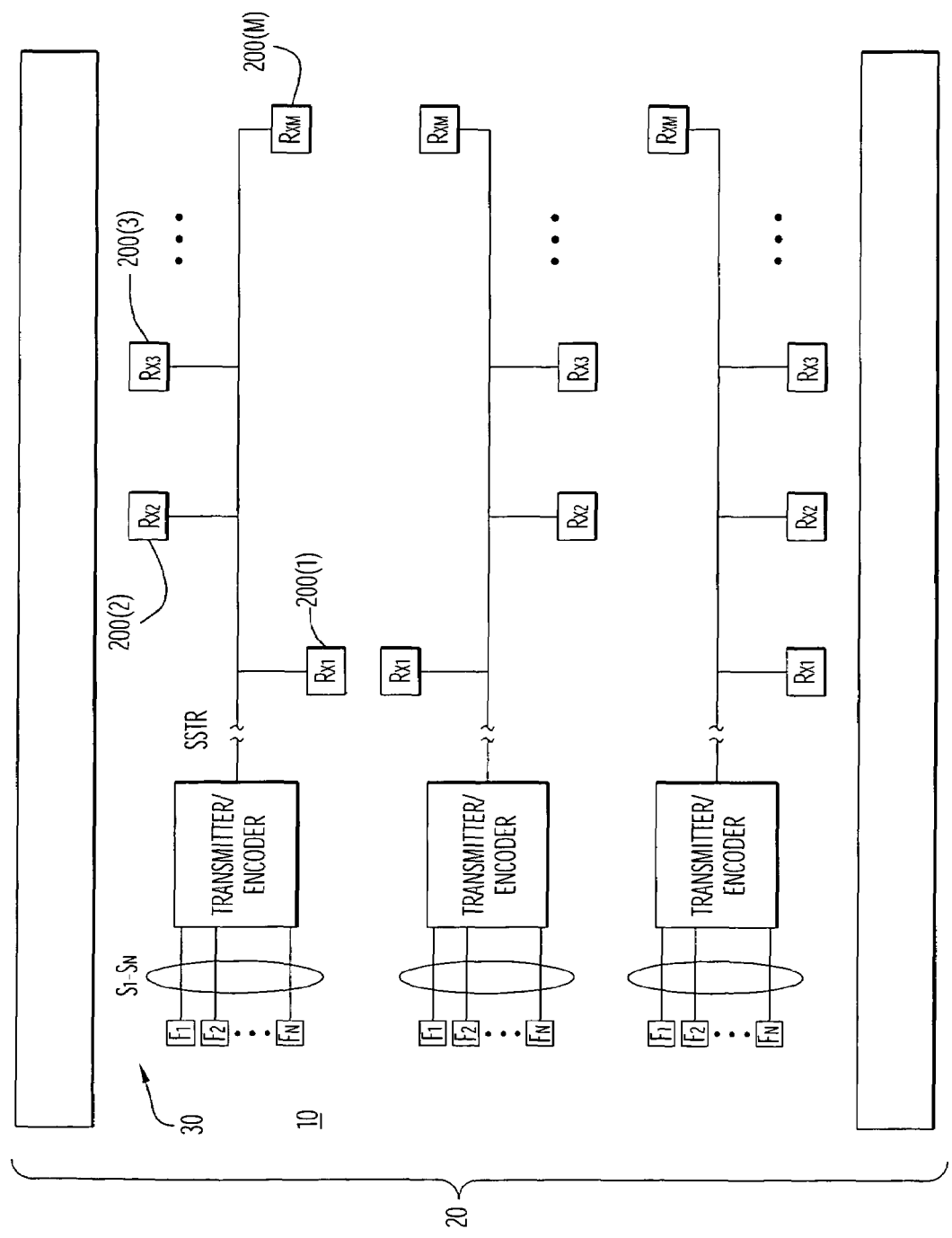
FIG. 1 is diagram of a system for distributing signals throughout an integrated circuit.

Referring first to FIG. 1, a signal distribution system 10 is shown that is designed for implementation on an integrated circuit (IC) 20. The system 10 may be positioned in a portion of the IC 20 where wire conductors are deployed to distribute signals to circuits at various locations in the IC 20. For example, in a dynamic random access memory (DRAM) IC, there is a portion of the IC called a "spine" where signals are routed. The system 10 may be deployed in the spine, shown at reference numeral 30, to distribute signals from one position in the spine 30 to a plurality of destinations at various positions throughout the spine 30.

The system 10 comprises a transmitter/encoder unit 100 that is connected to a plurality of receiver (Rx) units 200(1) to 200(M), each at a corresponding one of a plurality of destinations at various positions in the spine 30. In the IC 20, the system 10 may comprise one or several instances of the transmitter/encoder unit-receiver units combination. For example, three instances are shown in FIG. 1. For simplicity, the transmitter/encoder unit 100 is referred to hereinafter as a transmitter unit, though it is to be understood that it performs encoding and multiplexing (combining) functions. The transmitter unit 100 may be at a location in the spine, such as at one end or at or towards a central location of the spine 30, and the receiver units 200 are positioned at corresponding destination locations throughout the spine 30. Thus, the transmitter unit 100 is at a position in the IC remote from the positions of the receiver units 200.

The transmitter unit 100 receives as input a plurality of signals $S_1$ to $S_N$ to be distributed to the receiver units 200(1) to 200(M) at the corresponding destinations in the IC 20. The transmitter unit 100 time multiplexes the plurality of signals $S_1$ to $S_N$ into a single serial signal stream (SSTR) that is connected to the plurality of destinations. Each one of the signals $S_1$ to $S_N$ is output in a corresponding time slot in the serial signal stream. The means of connecting the transmitter unit 100 to the receiver units 200(1) to 200(M) will be described hereinafter in conjunction with FIG. 2. Each receiver unit 200(1) to 200(M) extracts one of the plurality of signals from the serial signal stream SSTR. The number of destinations M may be, but is not necessarily, equal to the number N of plurality of signals to be distributed.

The advantage of the system 10 is that it reduces wire congestion in the spine because a separate conductor is not needed to connect a signal from one location in the IC 20 to each destination. As a result, the height of the spine 30 may be reduced and/or the number of conductors in the spine 30 may be reduced. Shorter spines allow for formation of more ICs or "chips" per wafer. For example, many fuse-triggered signals and other direct current (DC) or near DC signals may be distributed throughout the spine 30. There is a plurality of fuses $F_1$ to $F_N$. The status of one or more of the fuses (blown or not blown) $F_1$ to $F_N$ determines the value of one or more of the plurality of signals $S_1$ to $S_N$.

Figure 2:
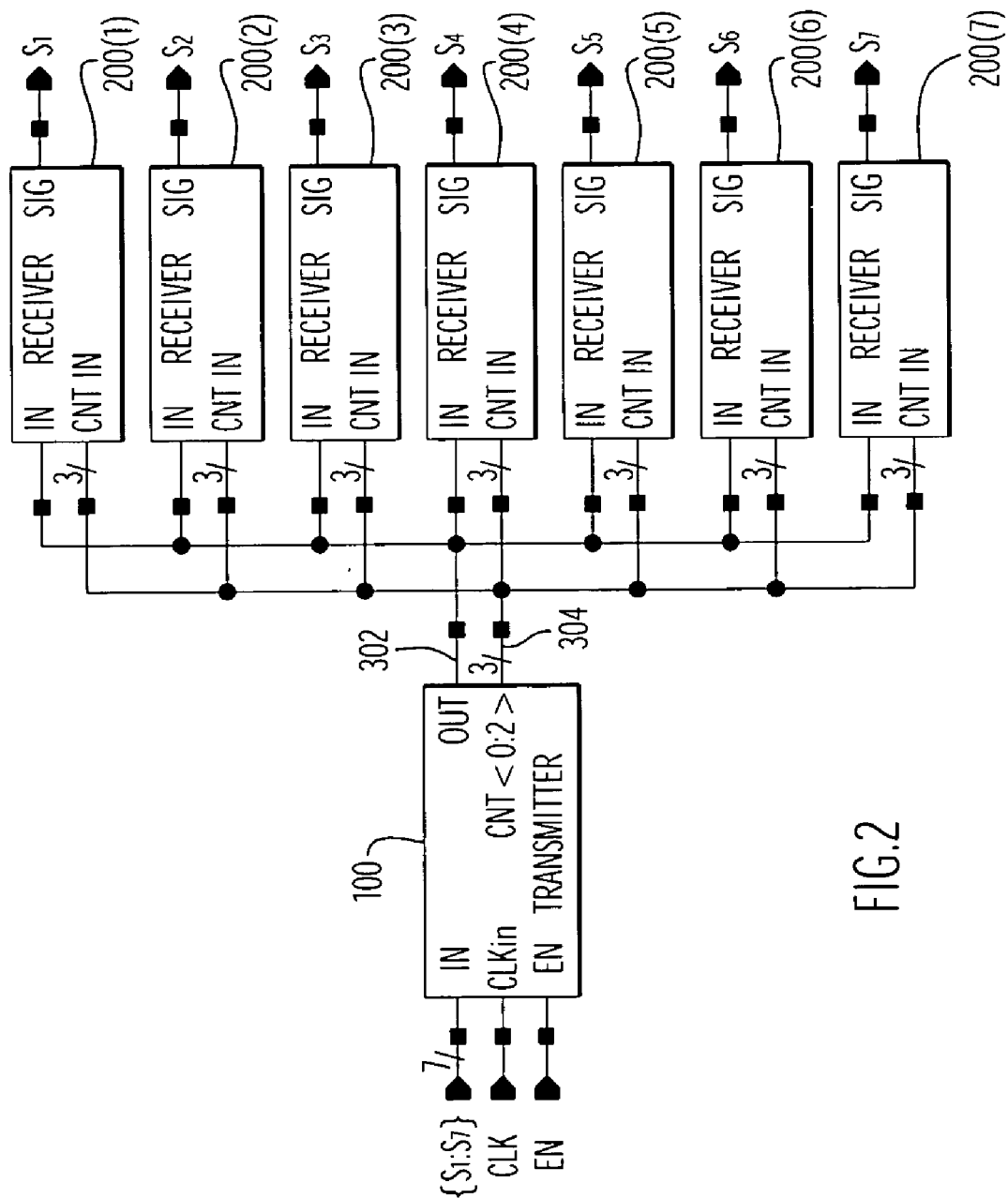
FIG. 2 is a more detailed block diagram of the signal distribution system.

Turning to FIG. 2, the system 10 will be described in more detail in an example where there are 7 (N=7) signals $\{S_1:S_7\}$ to be distributed among a plurality of destinations. In this example M=N=7, but as indicated above, this is not a requirement. The transmitter unit 100 has inputs for each of the plurality of signals $\{S_1:S_7\}$, a clock input (Clkin) for a clock signal (CLK) and an enable input for an enable signal (EN). In addition, the transmitter unit 100 has an output coupled to a first conductor 302 to which the serial signal stream SSTR is coupled for distribution to each receiver unit 200(1) to 200(7), a count output (CNT<0:2>) for a counter signal that the transmitter unit 100 generates. In this example, a three-bit counter {0:2} is sufficient to uniquely assign a count value to each of the plurality of signals $S_1$ to $S_N$. For some applications, the same signal may be distributed to two or more destinations. The counter signal is coupled to a bus 304 comprised of a plurality or conductors or wires that distribute corresponding bits (e.g., 3 bits) of the counter signal that represents the count value of the counter signal to each receiver unit 200(1) to 200(7). Each receiver unit 200(1) to 200(7) has an input (IN) connected to the first conductor 302, a counter input (CNT IN) connected to each of the conductors of the bus 304 and a signal output (SIG). The counter signal is coupled to each of the plurality of destinations to synchronize the extracting of a (particular) signal from a corresponding time slot in the signal stream.

Figure 3:
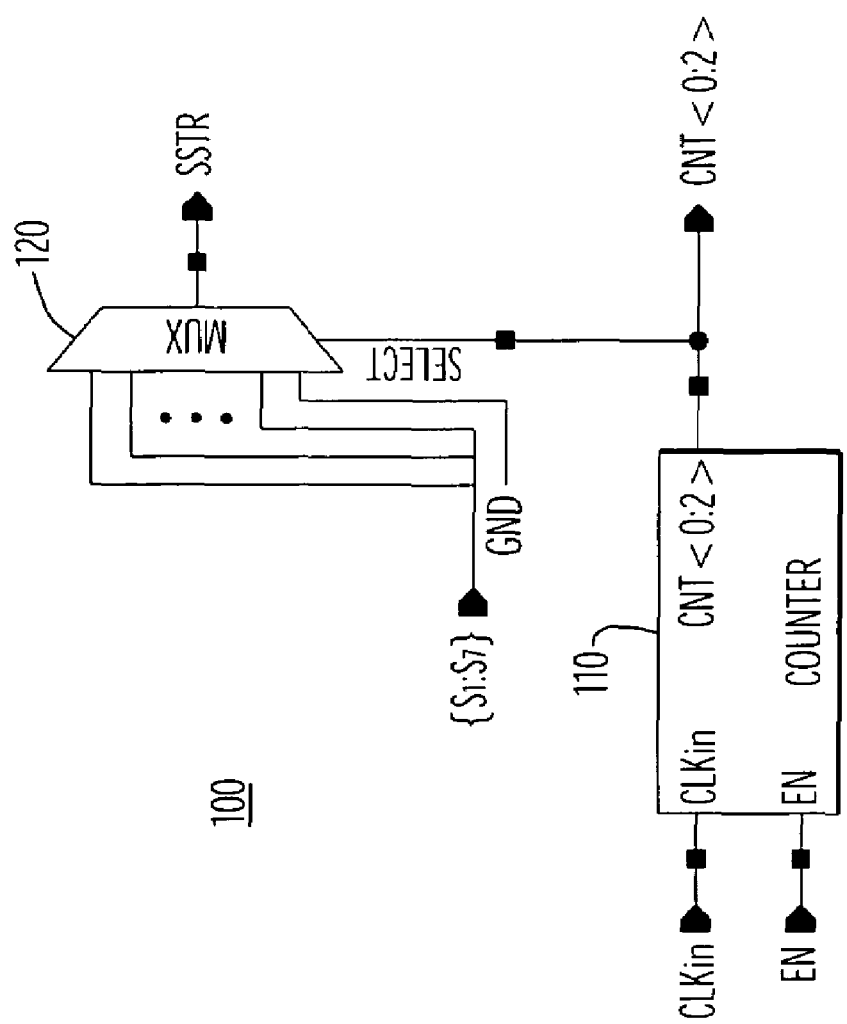
FIG. 3 is a block diagram of the transmitter/encoder unit of the signal distribution system.

Reference is now made to FIG. 3 that shows the transmitter unit 100 in greater detail. The transmitter/encoder unit 100 comprises a counter circuit 110 and a multiplexer circuit 120. The counter receives the CLK signal and the EN signal as input and outputs a counter signal CNT<0:2>.

The multiplexer circuit 120 has inputs for each of the plurality of input signals $S_1$ to $S_7$, an output on which the serial signal stream SSTR is provided and select inputs (SELECT). The multiplexer circuit 120 is an N×1 multiplexer, such as an 8×1 multiplexer in the case where N=7. In this example, an 8×1 multiplexer would have one unused input since there are 7 input signals. The multiplexer circuit 120 selects for coupling to the multiplexer output one of the plurality of signals $\{S_1:S_7\}$ based on a count value of the counter signal CNT<0:2>. Thus, the multiplexer circuit 120 time multiplexes the plurality of signals, where the count value determines the time slot for each of the plurality of signals to form the serial signal stream SSTR. The counter signal is supplied to each of the receiver units at corresponding destinations to enable each receiver unit to synchronize the extracting of a particular signal from a corresponding time slot in the serial signal stream SSTR.

Figure 4:
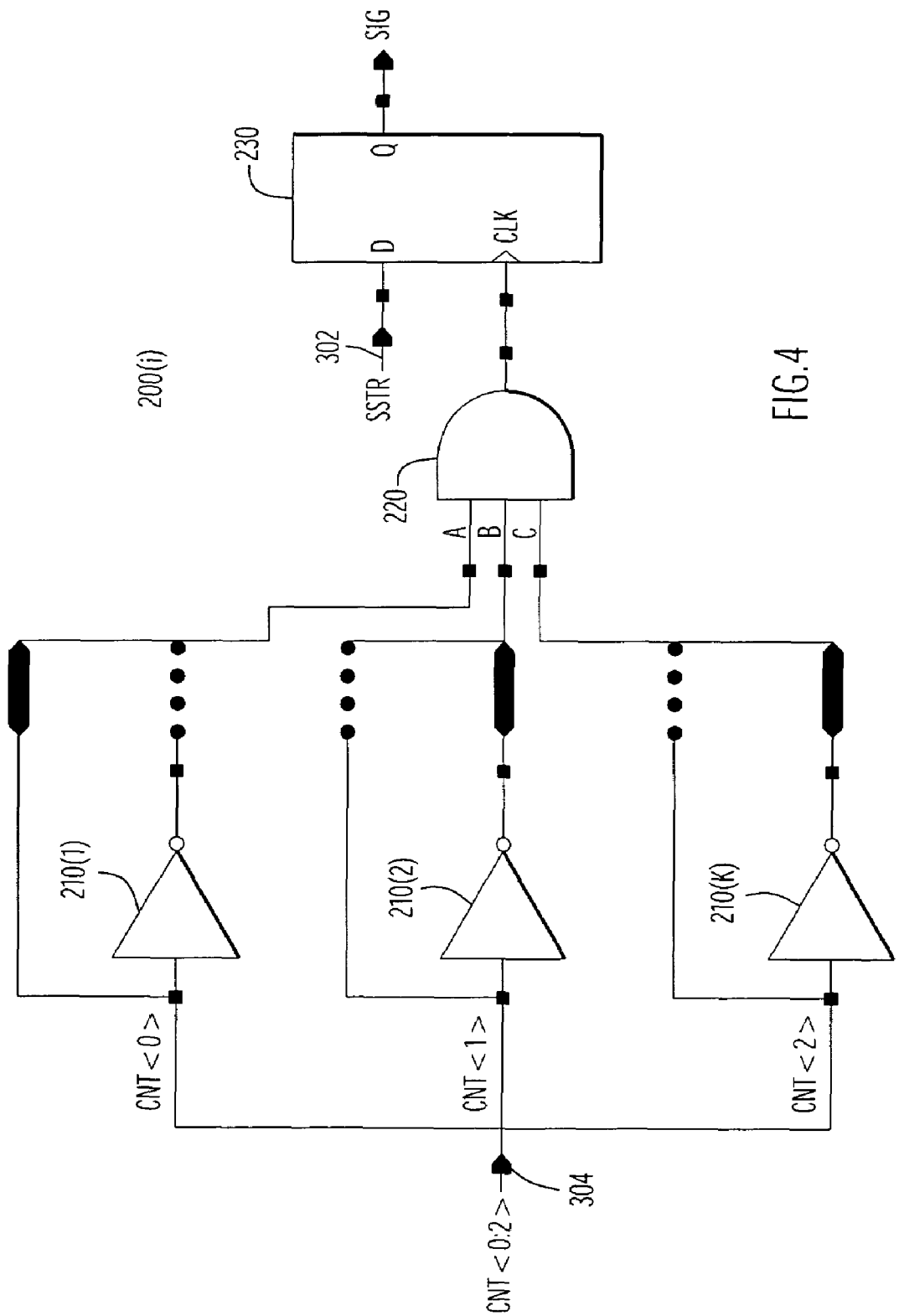
FIG. 4 is a block diagram of the receiver unit of the signal distribution system.

Turning to FIG. 4, a receiver unit 200(i) is shown in more detail. Each receiver unit 200(i) comprises a combinational logic circuit comprised of, for example, a plurality of inverters 210(1) to 210(K) and an AND gate 220. In the case where N=7, K=3 so that there are a plurality of inverters 210(1) to 210(K). The AND gate 220 has a plurality of inputs and an output. A flip-flop circuit 230 is coupled to the output of the AND gate 220. The flip-flop circuit 230 serves as a latch or storage device and is, for example, a D-type flip-flop, and comprises a D input, a CLK input and a Q output. The output of the AND gate 220 is coupled to the CLK input of the flip-flop circuit 230. The serial signal stream SSTR is coupled to the D input of the flip-flop circuit 230. The Q output of the flip-flop circuit 230 is one of the plurality of signals $\{S_1:S_7\}$ extracted from the serial signal stream SSTR.

For each inverter circuit 210(1) to 210(3), either its output or its input is coupled to a corresponding one of the plurality of inputs (A, B, C) of the AND gate 220 depending on a count signal value assigned to the receiver unit. The AND gate 220 generates an indication in the output signal, such as a High level, at its output based on values at each of the plurality of inputs, and in particular when all of its inputs to the AND gate 220 are High. The inverter circuit implementation shown in FIG. 4 is designed so that all receiver units can be made to be identical during most of the fabrication process. A receiver unit can be configured with only metal changes to select a particular signal from the transmitted sequence SSTR. A different design may involve custom logic for each receiver unit, which would save some transistor area at the expense of addressing inflexibility.

Figure 5:
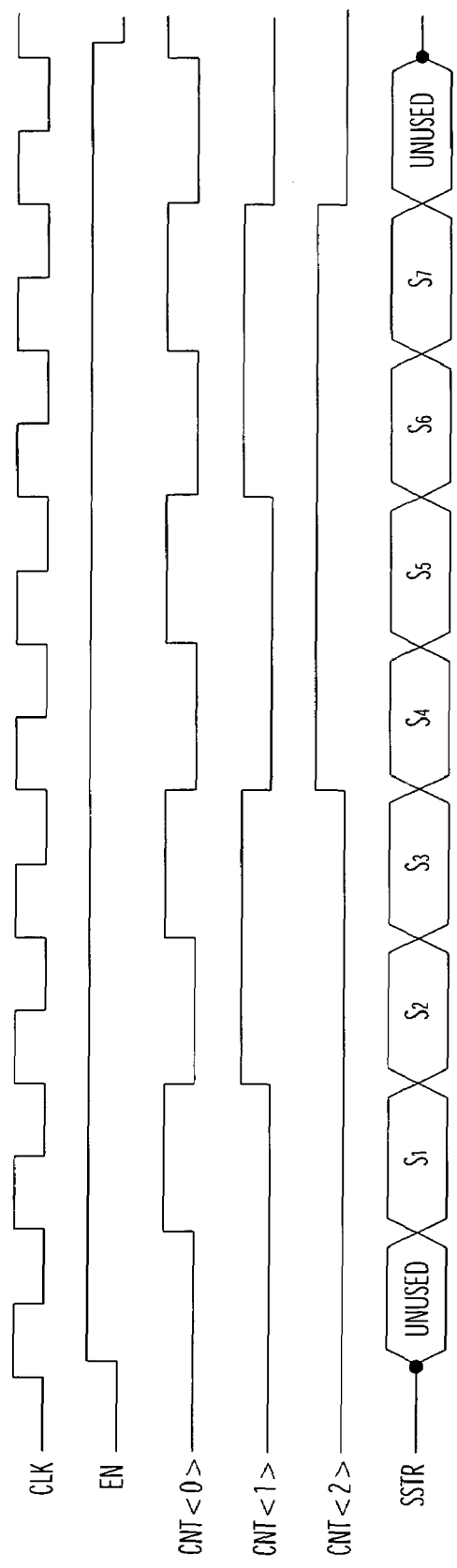
FIG. 5 is a timing diagram showing operation of the system for distribution of an exemplary set of signals.

The operation of the system 100 is described with reference to FIG. 5 in conjunction with FIGS. 2-4. Generally, the transmitter/encoder unit 100 is a modified multiplexer that distributes the signals to its destinations only when needed. The receiver units 200(1) to 200(M) are simple decode and latch circuits that store signals when they are not actively transmitted by the transmitter/encoder unit 100. The counter circuit 110 in the transmitter/encoder unit 100 cycles the multiplexer 120 through the signals to be transmitted in time slots of the time-multiplexed serial signal stream SSTR. The counter signal is also sent to each receiver unit for decoding and extracting the signal needed for each destination. A receiver unit 200(i) latches (a particular) one of the plurality of signals from the serial signal stream based on the count value of the counter signal.

The inverter circuits of each receiver unit are connected to the AND gate 220 in a manner depending on which of the plurality of signals the receiver unit is assigned to receive. For example, if a particular receiver unit is assigned to receive signal $S_3$, then the AND gate 220 output should go High when CNT<0:2> is {011}, the 3-bit binary representation of "3". Accordingly, for this receiver unit the output of the inverter 210(1) is connected to one of the inputs to the AND gate 220 (e.g., input A), the input of inverter 210(2) is connected to another input of AND gate 220 (e.g., input B), and the input of inverter 210(3) is connected to the remaining input of AND gate 220 (e.g., input C). Similarly, if a receiver unit is assigned to receive signal $S_7$, then the AND gate 220 should go High when CNT<0:2> is {111}. Accordingly, for this receiver unit the inputs to the inverters 210(1), 210(2) and 210(3) are connected to the inputs of the AND gate 220. Other receiver units are configured in a similar manner depending on the signal it is to extract from the serial signal stream. Two or more receiver units may be assigned to extract the same signal from the serial signal stream.

At power up, the EN signal goes High once the plurality of signals $\{S_1:S_N\}$ to be distributed are stable. While the EN signal is High, the counter circuit 110 increments at each rising edge of the CLK signal. For example, if there are 7 signals to be distributed, the counter circuit is a 3-bit circuit that changes each bit CNT<0>, CNT<1> and CNT<2> according to the incremented count value {000}, {001}, {010}, {011}, {100}, {101}, {110} and {111}, at which point it resets and begins counting again. It should be understood that if there are only 7 signals to be transmitted, the counter circuit could reset after {110} to be more efficient. The multiplexer circuit 120 is cycled through all of the input signals and in so doing time multiplexes the signals $S_1$ to $S_N$ to form the serial signal stream SSTR, and outputs the serial signal stream SSTR as shown in FIG. 5. Each receiver unit 200(1) to 200(M) monitors each of the bits of the counter signal CNT<0:2> and latches a corresponding or appropriate one of the signals from the serial signal stream SSTR. After all of the signals $S_1$ to $S_N$ have been successfully transmitted, the EN signal can go Low and the counter circuit 110 is reset and the count stops changing. The EN signal could go High as soon as there is power available to drive it (rather than waiting for all of the signals to be stable). Any incorrect signal values transmitted in an early cycle can be overwritten in the next transmit cycle through the signals. The circuit that drives the EN signal may include a timer function to determine when signals to be transmitted should be stable. After this time, at least one full transmit cycle needs to be completed before EN can go low.

The circuits shown in FIGS. 2-4 are only an example of an implementation of the signal distribution system 10. The receiver units 200(1) to 200(M) may comprise latches or edge-triggered registers. Moreover, the AND gate could be replaced by another type of gate, including but not limited to one or more of a NAND, OR, NOR, XOR or XNOR gate, with appropriate changes to the inverter circuits. If level-sensitive latches are used, one multiplexer input corresponding to the reset value of the counter must be connected to an unused DC value (e.g., ground) without a destination endpoint associated with it. This avoids having one of the receiver units held open when the transmitter is inactive. If edge-triggered registers are used, this is not necessary. When EN is low, it is possible to distribute an alternating current (AC) signal along the conduction wire 302 used by the serial signal stream SSTR. This can be driven either by a separate tri-state driver or through an unused input to the MUX. In a latch-based design, this signal could be the unused one required as detailed above.

In general, for N signals to be distributed, where $N \geq 2$, the number of wires or conductors needed (including wires for the counter signal and serial signal stream) is ceiling(log2(N))+1 for flip-flop designs and ceiling(log2(N+1))+1 for latch designs because of the reserved line. The reduction in the number of conductors or wires increases as the number of signals to be distributed increases. When N is a power of 2 (e.g., 2, 4, 8, 16, etc.) one wire is added for every doubling of N. Consequently, the wire savings increases exponentially and is very noticeable for large numbers of N. When a relatively slow clock is used, the transmission path may still be considered DC for many applications even while the system 10 is running.

Figure 6:
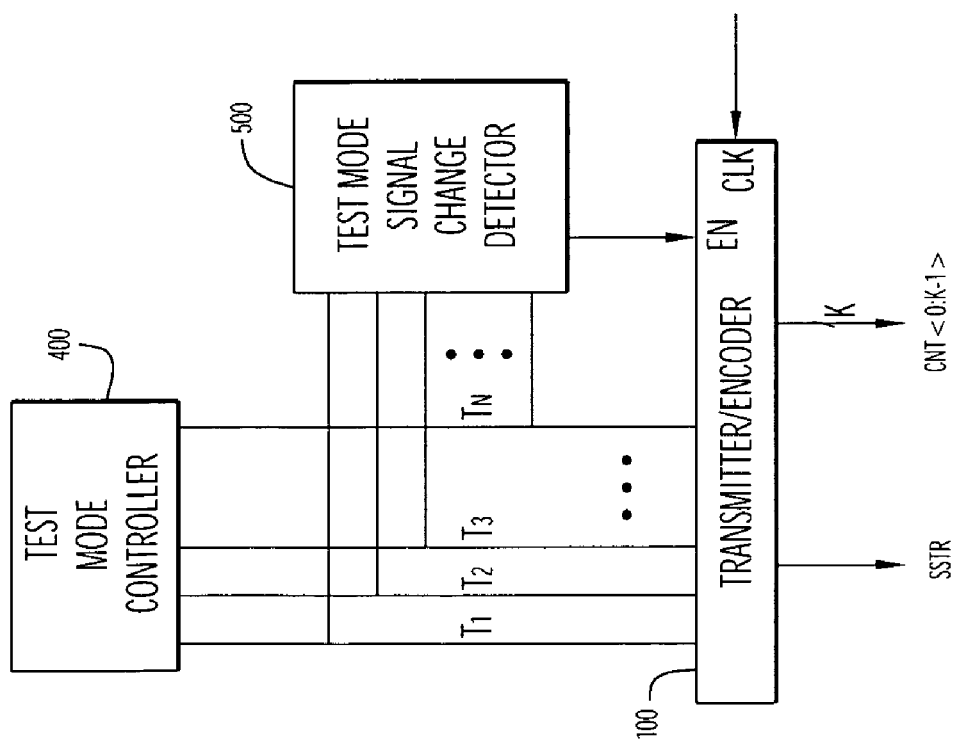
FIG. 6 is a block diagram showing an application of the signal distribution system for distributing test mode signals.

FIG. 6 shows a particular application of the system 10 in which test mode signals $T_1$ to $T_N$ produced by a test mode controller 400 are to be distributed to a plurality of destinations in an IC. A test mode signal change detector circuit 500 is provided that receives as input all of the test mode signals $T_1$ to $T_N$ and compares these signals with test mode signals provided at a previous test mode session to determine when one or more of the signals has changed. The receiver units at the destinations will have stored one of the plurality of signals received from the transmitter unit at a previous distribution session. Therefore, if none of the signals has changed, there is no need to distribute them again. However, if one or more of these signals have changed since a previous test mode session (or more generally since a prior signal distribution session), the circuit 500 causes the EN signal to the transmitter 100 to go High, which in turn causes the transmitter 100 to execute a signal distribution session to distribute the test mode signals (one or more of which have been determined to have changed) to the appropriate destinations.

As an example, the signal change detector circuit 500 may comprise a storage buffer that stores each of the plurality of signals that are distributed by the transmitter 100 for a distribution session, and a comparator. When a circuit such as the test mode controller 400 initiates a particular function, such as a test mode, the circuit 500 compares the plurality of signals received from the circuit 400 for a new distribution session with corresponding signals stored in the buffer for a previous distribution session. If one or more of signals for the new distribution session are different from corresponding signals in the previous distribution session, the circuit 500 will make the EN signal go High to cause the transmitter unit to initiate a signal distribution session for the plurality of signals. Otherwise, if there are no changes in the signals, the EN signal stays Low and a distribution session is not executed.

The counter circuit may be designed to be responsive to either a level of the EN signal or an edge of the EN signal. An edge trigger for EN would cause the counter to go through a full cycle regardless of how long EN is held high. This may be useful for distribution of test mode signals since the system 10 would be run periodically, rather than only at power up. A level trigger would cause the counter to run as long as EN is held high and reset immediately when it goes low.

To summarize, a system is provided for distributing signals throughout an integrated circuit (IC), comprising: a transmitter unit that combines a plurality of signals into a serial signal stream and couples the serial signal stream to a conductor for distribution to a plurality of destinations in the IC; and a plurality of receiver units, each at one of the plurality of destinations and connected to the conductor, wherein each receiver unit extracts one of the plurality of signals from the serial signal stream received on the conductor. It should be understood that from the foregoing description that a value (e.g., DC value) for a corresponding one of the plurality of signals is time multiplexed to form the serial signal stream or sequence. At any signal distribution session, the term "plurality of signals" is intended to mean these signal values that are time-multiplexed together to form the signal stream.

In addition, a system is provided for distributing signals throughout an IC, comprising: a counter circuit connected that receives as input a clock signal and generates as output a counter signal comprised of a plurality of bits representing a count value that is incremented based on the clock signal; and a multiplexer circuit coupled to the counter circuit, and that receives as input a plurality of signals to be distributed to a plurality of destinations throughout the IC, wherein the multiplexer circuit is responsive to the counter signal to select for output a corresponding one of the plurality of signals for each count value of the counter signal and thereby time multiplexes the plurality of signals into a single serial signal stream; a first conductor connected between an output of the multiplexer circuit and the plurality of destinations to convey the serial signal stream to each of the plurality of destinations; a bus comprised of a plurality of conductors connected between the counter circuit and each of the plurality of destinations to convey each bit of the counter signal representing the count value to each of the plurality of destinations; a combinational logic circuit that receives as input bits of the counter signal and generates an indication in an output signal when the count value of the counter signal matches an assigned count value; and a flip-flop circuit having a clock input, a data input and a data output, wherein the data input is coupled to the conductor carrying the serial signal stream, wherein the flip-flop circuit is responsive to the output signal of the combinational logic circuit to latch one of the plurality of signals in the serial signal from the data input to the data output.

Still further, a system is provided for distributing signals throughout an IC, comprising: means for combining a plurality of signals into a serial signal stream for distribution to a plurality of destinations in the IC; and at each of the plurality of destinations, receiving means for extracting from the serial signal stream one of the plurality of signals.

Said yet another way, a system is provided for distributing signals throughout an IC, comprising an encoder that assigns a time slot for each of plurality of signals that are sequentially coupled to a conductor; and a plurality of decoders, each at one of a plurality of positions in the IC and connected to the conductor, wherein each decoder extracts one of the plurality of signals received on the conductor. Similarly, a method is provided for distributing signals throughout an IC, comprising coupling each of a plurality of signals in individual time slots to a conductor at a location in the IC; and extracting one of the plurality of signals received on the conductor at a plurality of other locations in the IC.

Said still another way, a system is provided for distributing signals throughout an IC, comprising an encoder unit that time multiplexes a plurality of signals to corresponding time slots based on a select signal, and wherein the output of the encoder unit is coupled to a conductor; and a decoder unit connected to the conductor at each of a plurality of destinations in the IC, wherein the decoder unit also receives the select signal and extracts for storage one of the plurality of signals received on the conductor.

Furthermore, a method is provided for distributing signals throughout an IC comprising: combining a plurality of signals into a serial signal stream; coupling the serial signal stream over a conductor to each of a plurality of destinations in the IC; and at a destination, extracting one of the plurality of signals from the serial signal stream.

Similarly, a method is provided for distributing signals throughout an IC comprising: time multiplexing a plurality of signals to form a serial signal stream; coupling the serial signal stream over a conductor to each of a plurality of destinations in the IC; coupling to each of the plurality of destinations a counter signal used in assigning time slots when time multiplexing the plurality of signals to form the serial signal stream; and at each destination, extracting one of the plurality of signals from the serial signal stream based on the counter signal.

The system and methods described herein may be embodied in other specific forms without departing from the spirit or essential characteristics thereof. The foregoing embodiments are therefore to be considered in all respects illustrative and not meant to be limiting.

What is claimed is:

1. A system for distributing signals throughout an integrated circuit (IC), comprising:
    a. a transmitter unit that combines a plurality of signals into a serial signal stream and couples the serial signal stream to a conductor for distribution to a plurality of destinations in the IC, wherein the transmitter unit comprises:
        a multiplexer circuit that receives as input the plurality of signals and time multiplexes the plurality of signals to produce the serial signal stream;
        a counter circuit connected to the multiplexer circuit, wherein the counter circuit receives as input a clock signal and generates as output a counter signal having a count value that is incremented based on the clock signal, wherein the multiplexer circuit selects for output one of the plurality of signals based on the counter signal output by the counter circuit; and
    b. a plurality of receiver units, each at one of the plurality of destinations and connected to the conductor such that each receiver unit receives each of the plurality of signals in the serial signal stream and the counter signal, and based on the count value of the counter signal latches one of the plurality of signals from the serial signal stream, wherein each receiver unit comprises:
        a combinational logic circuit that receives as input bits of the counter signal representing the count value and generates an indication in an output signal when the count value of the counter signal matches an assigned count value, wherein the combination logic circuit comprises a plurality of inverter circuits each having an input and an output, wherein the input of each of the plurality of inverter circuits is connected to receive a corresponding bit of the counter signal, and an AND gate having a plurality of inputs and an output, wherein for each inverter circuit either the output or the input is coupled to a corresponding input of the AND gate depending on assigned count value, and wherein the AND gate generates the output signal that is coupled to the clock input of the flip-flop circuit, wherein the AND produces the indication in the output signal in response to signals at its inputs when the count value of the counter signal matches the assigned count value; and
        a flip-flop circuit having a clock input, a data input and a data output, wherein the data input is coupled to the conductor carrying the serial signal stream, wherein the flip-flop circuit is responsive to the output signal of the combinational logic circuit to latch one of the plurality of signals in the serial signal from the data input to the data output.

2. The system of claim 1, and further comprising a bus having a plurality of conductors connected to counter circuit that distribute corresponding bits of the counter signal, and wherein the input of each inverter circuit is coupled to a corresponding one of conductors of the bus.

3. The system of claim 1, wherein the transmitter unit is at a position in the IC remote from the receiver units.

4. The system of claim 3, wherein the transmitter unit is at one location of a spine of the IC and the receiver units are at various locations throughout the spine of the IC.

5. The system of claim 1, and further comprising a plurality of fuses coupled to the transmitter/encoder unit, wherein a status of one or more of the fuses determines a value of one or more of the plurality of signals.

6. The system of claim 1, and further comprising a signal change detection circuit that determines when one or more of the plurality of signals have changed since a previous signal distribution session, and in response thereto generates a signal that enables the transmitter/encoder unit to output the serial signal stream from the plurality of signals.

7. A system for distributing signals throughout an integrated circuit (IC), comprising:
    a. a counter circuit connected that receives as input a clock signal and generates as output a counter signal comprised of a plurality of bits representing a count value that is incremented based on the clock signal; and b. a multiplexer circuit coupled to the counter circuit, and that receives as input a plurality of signals to be distributed to a plurality of destinations throughout the IC, wherein the multiplexer circuit is responsive to the counter signal to select for output a corresponding one of the plurality of signals for each count value of the counter signal and thereby time multiplexes the plurality of signals into a single serial signal stream;

c. a first conductor connected between an output of the multiplexer circuit and the plurality of destinations to convey the serial signal stream to each of the plurality of destinations such that each destination receives each of the plurality of signals in the serial signal stream;

d. a bus comprised of a plurality of conductors connected between the counter circuit and each of the plurality of destinations to convey each bit of the counter signal representing the count value to each of the plurality of destinations;

e. a combinational logic circuit that receives as input bits of the counter signal and generates an indication in an output signal when the count value of the counter signal matches an assigned count value, wherein the combination logic circuit comprises a plurality of inverter circuits having an input and an output, wherein the input of each of the plurality of inverter circuits is connected to receive a corresponding bit of the counter signal, and an AND gate having a plurality of inputs and an output, wherein for each inverter circuit either the output or the input is coupled to a corresponding input of the AND gate depending on the assigned count value, and wherein the AND gate generates the output signal that is coupled to the clock input of the flip-flop circuit, wherein the AND produces the indication in the output signal in response to signals at its inputs when the count value of the counter signal matches the assigned count value; and f. a flip-flop circuit having a clock input, a data input and a data output, wherein the data input is coupled to the conductor carrying the serial signal stream, wherein the flip-flop circuit is responsive to the output signal of the combinational logic circuit to latch one of the plurality of signals in the serial signal from the data input to the data output.

8. The system of claim 7, wherein the counter circuit and multiplexer circuit are at a position in the IC remote from the combinational logic and flip-flop circuit.

9. The system of claim 7, and further comprising a plurality of fuses coupled to the multiplexer circuit, wherein a status of one or more of the fuses determines a value of one or more of the plurality of signals.

10. The system of claim 7, and further comprising a signal change detector circuit that detects whether one or more of the plurality of signals have changed since a previous distribution session and in response thereto generates the enable signal to cause said counter circuit and said multiplexer circuit to generate the serial signal stream from the plurality of signals for distribution to the plurality of destinations.

11. The system of claim 10, and further comprising a test mode controller circuit that produces test mode signals as the plurality of signals, and wherein the signal change detector circuit determines when one or more of the test mode signals has changed since a previous test mode procedure and in response thereto generates the enable signal.

12. A system for distributing signals throughout an integrated circuit (IC), comprising:

a. means for combining a plurality of signals into a serial signal stream for distribution to a plurality of destinations in the IC, wherein the means for combining comprises:

a counter circuit that receives as input a clock signal and an enable signal, and in response to the enable signal generates as output a counter signal having a count value that is incremented with each cycle of the clock signal; and a multiplexer circuit coupled to the counter circuit that receives as input the plurality of signals and in response to the counter signal selects for output a corresponding one of the plurality of signals for each value of the counter signal and thereby time multiplexes the plurality of signals into the single serial signal stream; and b. at each of the plurality of destinations, receiving means for receiving the serial signal stream comprising the plurality of signals and for extracting from the serial signal stream one of the plurality of signals, wherein the receiving means comprises:

a plurality of inverter circuits each having an input and an output, wherein the input of each of the plurality of inverter circuits is connected to a bit of the counter signal that represents the count value;

a combinational logic circuit that receives as input bits of the counter signal and generates an indication in an output signal when the count value of the counter signal matches an assigned count value; and a flip-flop circuit having a clock input, a data input and a data output, wherein the data input is coupled to receive the serial signal stream, wherein the flip-flop circuit is responsive to the output signal of the combinational logic circuit to latch one of the plurality of signals in the serial signal from the data input to the data output.

13. The system of claim 12, wherein the means for combining is at one location of a spine of the IC and the receiving means are at various locations throughout the spine of the IC.

* * * * *